US008410835B1

(12) United States Patent
Sorna et al.

(10) Patent No.: US 8,410,835 B1
(45) Date of Patent: Apr. 2, 2013

(54) LEAKAGE TOLERANT PHASE LOCKED LOOP CIRCUIT DEVICE

(75) Inventors: Michael A. Sorna, Hopewell Junction, NY (US); Pradeep Thiagarajan, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/342,453

(22) Filed: Jan. 3, 2012

(51) Int. Cl.
*H03L 7/06* (2006.01)

(52) U.S. Cl. ....................................... 327/157; 327/148

(58) Field of Classification Search .................. 327/148, 327/157
See application file for complete search history.

(56) References Cited

U.S. PATENT DOCUMENTS

| | | | |
|---|---|---|---|
| 6,473,485 B1 | 10/2002 | Fernandez-Texon | |
| 6,570,420 B1 * | 5/2003 | Trivedi et al. | 327/156 |
| 6,570,421 B1 * | 5/2003 | Gauthier et al. | 327/156 |
| 6,570,422 B1 * | 5/2003 | Trivedi et al. | 327/157 |
| 6,570,423 B1 * | 5/2003 | Trivedi et al. | 327/157 |
| 6,573,770 B1 * | 6/2003 | Gauthier et al. | 327/156 |
| 6,597,219 B1 * | 7/2003 | Trivedi et al. | 327/158 |
| 6,680,654 B2 | 1/2004 | Fischer et al. | |
| 6,998,887 B2 * | 2/2006 | Gauthier et al. | 327/156 |
| 7,049,866 B2 | 5/2006 | Wilson | |
| 7,782,143 B2 | 8/2010 | Clementi | |
| 8,242,821 B2 * | 8/2012 | Bae et al. | 327/158 |
| 2010/0321076 A1 * | 12/2010 | Bae et al. | 327/158 |
| 2011/0304365 A1 * | 12/2011 | Bunch | 327/157 |
| 2012/0038400 A1 * | 2/2012 | Talaga, Jr. | 327/156 |
| 2012/0212268 A1 * | 8/2012 | Kim | 327/158 |

* cited by examiner

*Primary Examiner* — Adam Houston
(74) *Attorney, Agent, or Firm* — H. Barrett Spraggins; Daniel H. Schnurmann; Biggers & Ohanian, LLP.

(57) ABSTRACT

Leakage tolerant phase locked loop (PLL) circuit devices and methods of locking phases of output phase signals to a phase of a reference signal using a leakage tolerant PLL circuit device are provided. Embodiments include a PLL circuit device comprising: a primary loop and a secondary correction circuit. The primary loop includes a phase detector, an error controller, a voltage controlled oscillator (VCO), and feedback divider. The secondary correction circuit is configured to generate and provide a secondary error-frequency signal to the error controller. The secondary correction circuit is configured to generate the secondary error-frequency signal in response to detecting a particular edge of a divided VCO output signal. The primary loop is configured to control a frequency adjustment based on at least one of a first error-frequency-increase signal, a first error-frequency-decrease signal, and the secondary error-frequency signal.

20 Claims, 8 Drawing Sheets

PRIOR ART

Generate, By A Primary Loop Of A Phase Locked Loop (PLL) Circuit Device, A Feedback Signal Having A Phase That Substantially Matches A Phase Of The Reference Signal, Wherein The Primary Loop Includes A Phase Detector, An Error Controller, A Voltage Controlled Oscillator (VCO), And A Feedback Divider 702

Generate, By The VCO, A VCO Output Signal And Provide The VCO Output Signal To The Feedback Divider 704

Generate, By The Phase Detector, One Of A First Error-frequency-increase Signal And A First Error-frequency-decrease Signal Based On A Determination Of The Phase Difference Between The Feedback Signal And The Reference Signal 706

Generate, By A Secondary Correction Circuit Divider Coupled Between The VCO And The Secondary Correction Circuit, A Divided VCO Output Signal Based On The VCO Output Signal 708

Generate, By The Secondary Correction Circuit Of The PLL Circuit Device, A Pulse Of A Secondary Error-frequency Signal In Response To Detecting A Particular Edge Of The Divided VCO Output Signal 710

Control, By The Primary Loop, A Frequency Adjustment Provided By The VCO To The VCO Output Signal, Based On At Least One Of The First Error-frequency-increase Signal, The First Error-frequency-decrease Signal, And The Secondary Error Signal 712

FIG. 7

LEAKAGE TOLERANT PHASE LOCKED LOOP CIRCUIT DEVICE

BACKGROUND OF THE INVENTION

1. Field of the Invention

The field of the invention is data processing, or, more specifically, leakage tolerant phase locked loop (PLL) circuit devices and methods of locking a phase of a feedback signal to a phase of a reference signal using a leakage tolerant phase locked loop (PLL) circuit device.

2. Description of Related Art

A phase locked loop (PLL) circuit device is a control system that generates an output signal whose phase is locked relative to a phase of an input reference signal. With frequency being a derivative of phase, the output signal's frequency is hence locked relative to frequency of input reference signal. Consequently, a PLL can track an input frequency, or can generate a frequency that is a multiple of input frequency used for indirect frequency synthesis. For further explanation, FIG. 1 sets forth a diagram of a PLL circuit device found in the prior art. In the PLL circuit device of FIG. 1, the phase difference between a reference signal (118) and a feedback signal (128) is translated by a phase detector (102) into two signals, increase frequency signal (120) and decrease frequency signal (122). The two signals (120, 122) control a charge pump (104) that steers current into or out of a filter capacitor (106) via a filter control signal (124), causing the voltage across the filter capacitor (106) to increase or decrease. In each cycle, the time during which the charge pump (104) is turned-on is proportional to the phase difference between the reference signal (118) and the feedback signal (128). Hence, the charge delivered by the charge pump (104) is also dependent on the phase difference. The voltage on the filter capacitor (106) is used to control a voltage controlled oscillator (VCO) (108), which increases or decreases the frequency of a VCO output signal (130). The VCO outputs (130) may have a frequency that is larger than the frequency of the reference signal (118) and as such, a feedback divider (190) may be used to generate the feedback signal (128) to compare with the reference signal (118). Thus, increasing or decreasing the frequency of the VCO output signal (130) also increases or decreases the frequency of the feedback signal (128). That is, the filter capacitor (106) is instrumental in controlling how efficiently the VCO (108) and the PLL circuit device, as a whole, is able to lock the phase of the feedback signal (128) to the phase of the reference signal (118).

In an effort to control costs or reduce the size of the components with PLL circuit devices, manufacturers may select a filter capacitor with poor leakage characteristics. A leaky filter capacitor may discharge some of its charge during the operation of the PLL circuit device. Because a PLL circuit device relies on the charge of its filter capacitor to indicate to a VCO an amount to increase or decrease frequencies of the VCO output signal, a leaky filter capacitor may cause the VCO to not adjust the frequency of the VCO output signal as indicated by the phase difference determined by the phase detector. That is, a leaky filter capacitor could increase the number of frequency cycles that the PLL circuit device must operate to lock the phase of the feedback signal to a phase of a reference signal. In some instances, the degree of leakage in the filter capacitor may prevent a PLL circuit device from completely phase locking the feedback signal to the reference signal.

For further explanation, FIG. 2 sets forth a diagram illustrating a transient response of the PLL circuit device of FIG. 1, configured with a leaky filter capacitor. As explained above, the goal of a PLL circuit device is to lock a phase of a feedback signal to a phase of a reference signal.

The transient response of FIG. 2 illustrates the reference signal (118) and the feedback signal (128) at multiple time points (250-257) over time (290). At the time point (250), there is a phase difference between the two signals (118, 128). That is, the rising edge of the reference signal (118) begins at the time point (250) and the next rising edge of the feedback signal (128) begins at the time point (251). In response to detecting this difference between the two signals (118, 128), the phase detector (102) generates the increase frequency signal (120) during the two time points (250, 251) and the charge pump provides a corresponding charge to the filter capacitor (106). During the time points (250, 251), the VCO control signal (126) is generated that corresponds to the charge of the filter capacitor (106). However, between the time point (251) and the time point (252), the increase frequency error signal (120) is not generated and the charge pump (104) does not continue to charge the filter capacitor (106). In the examples of FIGS. 1-2, the reference plate of the filter capacitor (106) is coupled to a low potential or ground, hence leakage in the filter capacitor (106) occurs in that direction. Because the filter capacitor (106) is leaky, the filter capacitor (106) begins to discharge and thus the VCO control signal (126) begins to decrease. In fact, at the time point (252), the filter capacitor (106) is at substantially the same charge it was at before the time point (250). As a consequence of the filter capacitor (106) discharging, the frequency of the feedback signal (128) is not increased and the same increase frequency signal (120) is generated between time points (252-257). That is, the leakage in the filter capacitor (106) prevents the PLL circuit device of FIG. 1 from locking the phase of the feedback signal (128) to a phase of the reference signal (118). Hence, preventing the VCO output signal (130) from reaching and settling at a target frequency. This also causes wide frequency variations during each reference signal cycle, translating to wide jitter of the VCO output signal (130).

SUMMARY OF THE INVENTION

Leakage tolerant phase locked loop (PLL) circuit devices and methods of locking a phase of a feedback signal to a phase of a reference signal using a leakage tolerant phase locked loop (PLL) circuit device are provided. Embodiments include a leakage tolerant PLL circuit device that includes a primary loop that includes a phase detector, an error controller, a voltage controlled oscillator (VCO), and a feedback divider. The primary loop is configured to generate the feedback signal having a phase that substantially matches a phase of the reference signal. The VCO is configured to generate a VCO output signal and to provide the VCO output signal to a secondary correction circuit divider and the feedback divider. The phase detector is configured to generate one of a first error-frequency-increase signal and a first error-frequency-decrease signal based on a determination of the phase difference between the feedback signal and the reference signal.

The PLL circuit device also includes a secondary correction circuit and a secondary correction circuit divider. The secondary correction circuit includes an error generator. The secondary correction circuit is configured to generate a secondary error-frequency signal. The secondary correction circuit divider is configured to generate a divided VCO output signal based on the VCO output signal. The error generator is configured to generate the secondary error-frequency signal in response to detecting a particular edge of the divided VCO output signal. The primary loop is also configured to control, based on at least one of the first error-frequency-increase signal, the first error-frequency-decrease signal, and the secondary error-frequency signal, a frequency adjustment provided by the VCO to the VCO output signal.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 7 sets forth a flowchart of an example of a method of locking a phase of a feedback signal to a phase of a reference signal using a leakage tolerant phase locked loop (PLL) circuit device according to embodiments of the present invention.

DETAILED DESCRIPTION OF EXEMPLARY EMBODIMENTS

Figure 3:
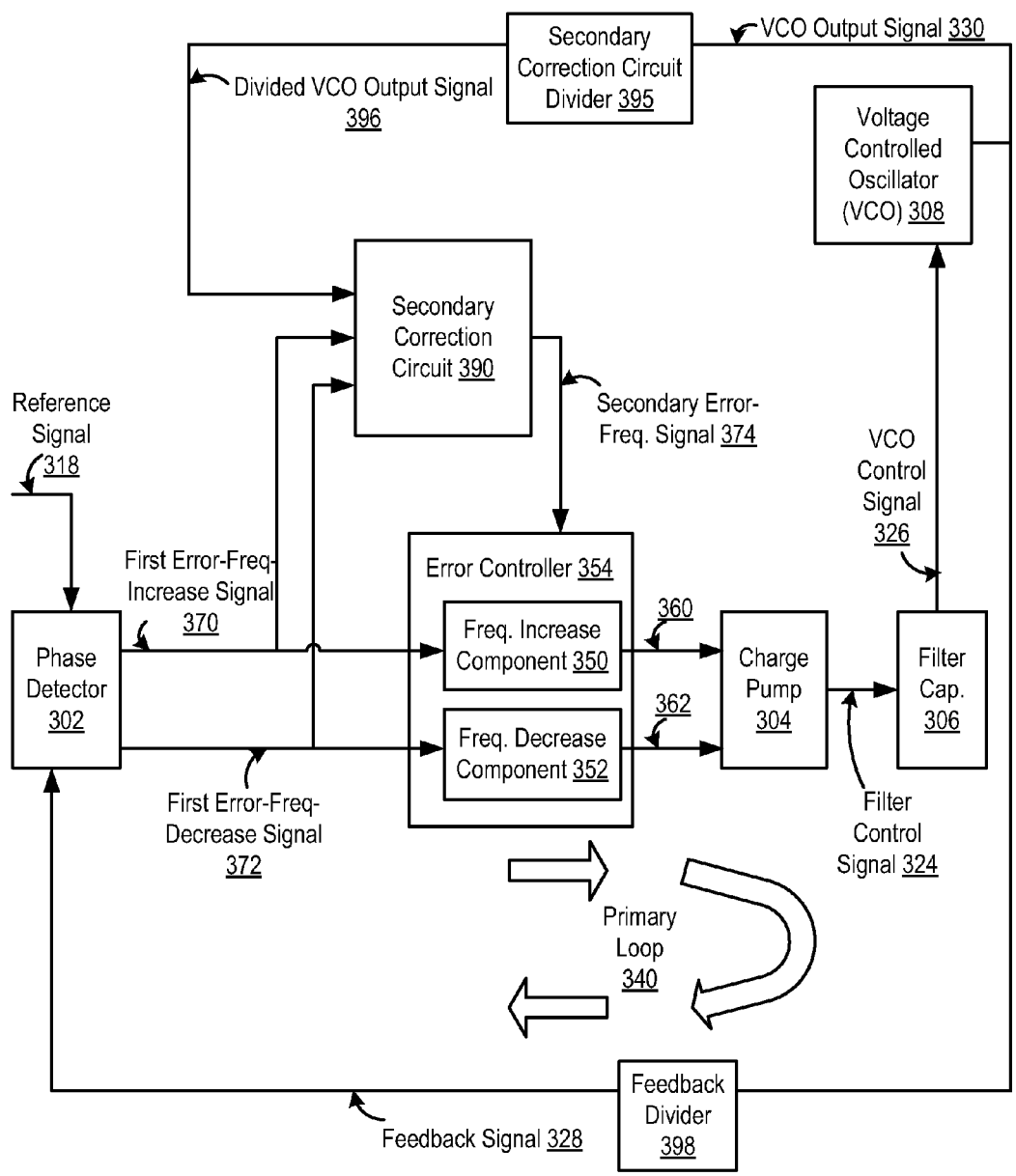
FIG. 3 sets forth a diagram of an example of a leakage tolerant PLL circuit device configured according to embodiments of the present invention.

Exemplary leakage tolerant phase locked loop (PLL) circuit devices and methods of locking a phase of a feedback signal to a phase of a reference signal using a leakage tolerant phase locked loop (PLL) circuit device in accordance with the present invention are described with reference to the accompanying drawings, beginning with FIG. 3. FIG. 3 sets forth a diagram of an example of a leakage tolerant PLL circuit device configured according to embodiments of the present invention. The PLL circuit device of FIG. 3 includes a primary loop (340) and a secondary correction circuit (390) and a secondary correction circuit divider 395. The primary loop (340) includes a phase detector (302), an error controller (354), a charge pump (304), a filter capacitor (306), a voltage controlled oscillator (308), and a feedback divider (398).

The filter capacitor (306) may be implemented in a number of different ways according to embodiments of the present invention. For example, in one embodiment, the filter capacitor (306) is tied to a reference potential. In another embodiment, the filter capacitor (306) may be a differential filter that has at least one capacitor and two control signal points.

A voltage controlled oscillator (VCO) is an electronic oscillator designed to be controlled in oscillation frequency by one or more voltage inputs. An electronic oscillator is an electronic circuit that produces a repetitive electronic signal, often a sine wave or a square wave. The frequency of oscillation in a VCO is varied by the applied DC voltage, while modulating signals may also be fed into the VCO to cause frequency modulation or phase modulation. In the example of FIG. 3, the VCO (308) increases or decreases the frequency of the VCO output signal (330) based on the VCO control signal (326) provided by the filter capacitor (306). The VCO output signal (330) may have a frequency that is larger than the frequency of the reference signal (318) and as such, a feedback divider (398) may be used to divide the VCO output signal (330) into the feedback signal (328) which can be used to compare with the reference signal (318).

A phase detector is a circuit that generates a voltage signal which represents the difference in phase between two signal inputs. The voltage signal generated by the phase detector (302) may be an analog signal or a digital signal. In the PLL circuit device of FIG. 3, the phase detector (302) is configured to translate the phase difference between the reference signal (318) and the feedback signal (328) into either a first error-frequency-increase signal (370) or a first error-frequency-decrease signal (372). The phase detector (302) generates the first error-frequency-increase signal (370) if the comparison between the reference signal (318) and the feedback signal (328) indicates that the frequency adjustment provided by the VCO (308) should be increased. The duration of the first error-frequency-increase signal (370) depends on the phase difference of the feedback signal (328) lagging behind the reference signal (318). The phase detector (302) generates the first error-frequency-decrease signal (372) if the comparison between the reference signal (318) and the feedback signal (328) indicates that the frequency adjustment provided by the VCO (308) should be decreased. The duration of the first error-frequency-decrease signal (372) depends on the phase difference of the feedback signal (328) leading the reference signal (318). The phase detector generates either the first error-frequency-increase signal (370) or the first error-frequency-decrease signal (372) only once per reference cycle because it compares the reference cycle (318) to the feedback signal (328) on a particular edge, which occurs only once per cycle. The first error-frequency-increase signal (370) and the first error-frequency-decrease signal (372) are provided to the error controller (354).

In the example of FIG. 3, the error controller (354) includes a frequency increase component (350) and a frequency decrease component (352). The frequency increase component (350) is coupled to receive the first error-frequency-increase signal (370) and to provide an increase charge indication (360) to the charge pump (304). In the example of FIG. 3, the VCO (308) is designed such that an increased charge (hence, higher voltage on the VCO control signal (326)) leads to an increased frequency adjustment provided by the VCO. In another embodiment, the VCO (308) may be designed for opposite functionality in which a decrease charge indication leads to increased frequency adjustment provided by the VCO. The frequency decrease component (352) is coupled to receive the first error-frequency-decrease signal (372) and to provide a decrease charge indication (362) to the charge pump (304). In the example of FIG. 3, either the frequency increase component (350) or the frequency decrease component (352) is coupled to the secondary correction circuit (390) to receive the secondary error-frequency signal (374) that can impact the pulse width and duration of any increase charge indications (360) or decrease charge indications (362) that the error controller (354) provides to the charge pump (304). Pulse widths of the secondary error-frequency signal (374) correspond to the previously arrived of one of the first error-frequency-increase signal (370) and the first error-frequency-decrease signal (372).

The charge pump (304) of FIG. 3 is configured to steer current into or out of the filter capacitor (306) via a filter control signal (324), causing the voltage across the filter capacitor (306) to increase or decrease. In each cycle, the time during which the charge pump (304) is turned-on is proportional to the phase difference between the reference signal (318) and the feedback signal (328). Hence, the charge delivered by the charge pump (304) is also dependent on the phase difference between the reference signal (318) and the feedback signal (328). However, as explained above, if the filter capacitor (306) leaks charge, then the VCO control signal (326) provided to the VCO (308) may not indicate the correct amount that the VCO (308) should adjust the frequency of the reference signal (318).

The secondary correction circuit (390) of FIG. 3 is configured to provide the secondary error-frequency signal (374) to help the error controller (354), the charge pump (304), and filter capacitor (306) maintain the charge within the filter capacitor (306). In the example of FIG. 3, the secondary correction circuit (390) is configured to receive a signal and in response to detecting a particular edge of the signal, generate a secondary error-frequency signal. The purpose of the secondary error-frequency signal (374) is to periodically instruct the error controller (354) to instruct the charge pump (304) to charge the filter capacitor (306). To control the periods that this instruction is provided depends on the input signal to the second correction circuit (390). The secondary correction circuit (390) may use the VCO output signal (330) as input, or as in the example of FIG. 3, a secondary correction circuit divider (395) may be utilized to adjust the frequency of the VCO output signal (330) and generate a divided VCO output signal (396). The secondary correction circuit (390) may examine the divided VCO output signal (396) for a particular edge and generate a pulse of the secondary error-frequency signal (374) every time a particular edge is detected. That is, the secondary correction circuit divider (395) may be used to control how many pulses of the secondary error-frequency signal (374) are generated in a cycle of the reference signal (318).

For example, if the secondary correction circuit (390) detects the first error-frequency-increase signal (370) or the first error-frequency-decrease signal (372), then the secondary correction circuit (390) will generate a secondary error-frequency signal each time that a particular edge is detected on the divided VCO output signal (396). Because the divided VCO output signal (396) has edges that are spread out over a cycle of a reference signal, the secondary correction circuit (390) may generate a set number of pulses of the secondary error-frequency signal (374) per reference cycle. That is, the error controller (354) may receive within a single reference signal cycle, a first error-frequency-increase signal (370) or a first error-frequency-decrease signal (372) and multiple pulses of the secondary error-frequency signal (374).

As indicated above, either the frequency increase component (350) or the frequency decrease component (352) is configured to receive the secondary error-frequency signal (374). For example, in one embodiment, the frequency increase component (350) is configured to receive the first error-frequency-increase signal (370) and the secondary error-frequency signal (374) and the frequency decrease component (352) is configured to only receive the first error-frequency-decrease signal (372). In another embodiment, the frequency increase component (350) is configured to only receive the first error-frequency-increase signal (370) and the frequency decrease component (352) is configured to receive the first error-frequency-decrease signal (372) and the secondary error-frequency signal (374). Determining which frequency component (350, 352) to couple to the secondary correction circuit (390) depends upon the direction that the filter capacitor (306) leaks. Filter capacitor leakage leads to control voltage degradation towards the other potential of the capacitor. The direction of the polarity of the secondary correction circuit (390) (i.e., which frequency component (350, 352) the secondary correction circuit (390) is coupled) is selected such that the filter capacitor (306) voltage is moved in a direction away from its other plate potential. For example, if the filter capacitor (306) degradation leads to a reduced frequency adjustment, the secondary correction circuit (390) may be coupled to the frequency increase component (350) to increase the frequency adjustment provided by the VCO (308). However, if the filter capacitor (306) degradation leads to an increased frequency, then the secondary error-frequency signal may be coupled to the frequency decrease component (352) to slow down the frequency adjustment provided by the VCO (308).

The secondary error-frequency signal (374) increases or decreases the frequency adjustment provided by the VCO (308) by indicating to either the frequency increase component (350) or the frequency decrease component (352) to instruct the charge pump (304) to provide charge more frequently to the filter capacitor (306). That is, initially the charge pump (304) charges the filter capacitor (306) for a specific duration each reference cycle based on either the first error-frequency-increase signal (370) or the first error-frequency-decrease signal (372). However, after the VCO (308) generates the VCO output signal (330), the secondary correction circuit (390) will generate pulses of the secondary error-frequency signal periodically throughout a reference cycle. The error controller (354) uses the secondary error-frequency signal (374) to instruct the charge pump (304) to steer current into the filter capacitor (306) periodically throughout the reference signal cycle. By periodically recharging the filter capacitor (306), the leakage of the filter capacitor (306) may be offset and the VCO (308) may receive VCO control signals (326) that instruct the VCO (308) to provide the proper frequency adjustment. That is, the PLL circuit of FIG. 3 reduces or fully compensates the negative effect of excessive filter capacitor leakage.

Figure 4:
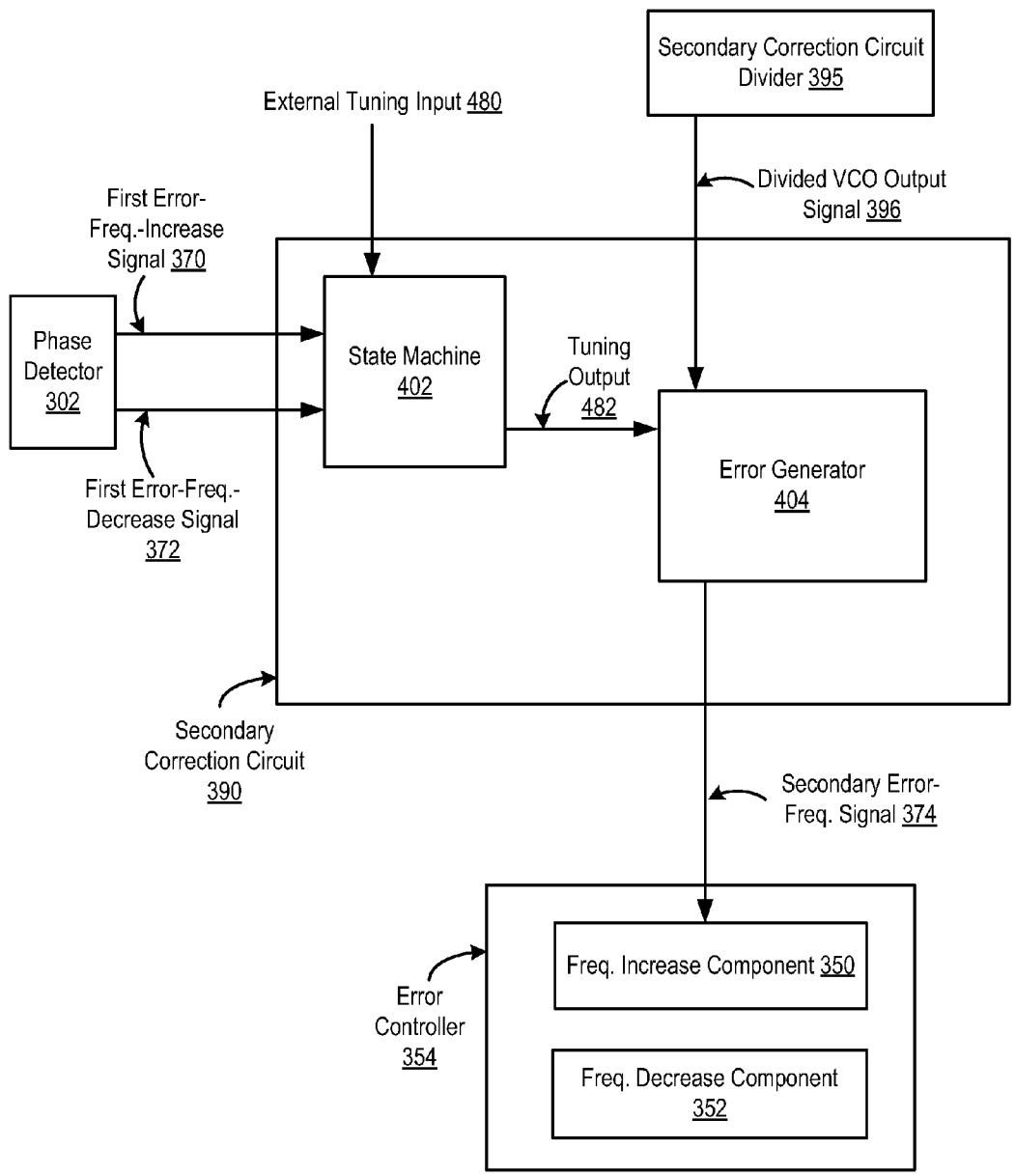
FIG. 4 sets forth a diagram of another example of a leakage tolerant PLL circuit device configured according to embodiments of the present invention.

FIG. 4 sets forth a diagram of another example of a leakage tolerant PLL circuit device configured according to embodiments of the present invention. The secondary correction circuit (390) of FIG. 4 includes a state machine (402) and an error generator (404).

In the example of FIG. 4, the state machine (402) is coupled to the phase detector (302) and to the error generator (404), which is coupled to one of the frequency increase component (350) and the frequency decrease component (352). Whether the error generator (404) is coupled to the frequency increase component (350) or the frequency decrease component (352) may be based on the configuration of the filter capacitor (306) and the VCO (308).

For example, in a first PLL circuit device configuration in which the filter capacitor (306) has a reference that is coupled to a lower potential and the VCO (308) is designed to increase the frequency adjustment in response to a rising VCO control signal (326), the secondary error-frequency signal (374) may be coupled to the frequency increase component (350). In a second PLL circuit device configuration in which the filter capacitor (306) has a reference that is coupled to a higher potential and the VCO (308) is designed to increase the frequency adjustment in response to a falling VCO control signal (326), the secondary error-frequency signal (374) may be coupled to the frequency increase component (350). In a third PLL circuit device configuration in which the filter capacitor (306) has a reference that is coupled to a lower potential and the VCO (308) is designed to decrease the frequency adjustment in response to a rising VCO control signal (326), the secondary error-frequency signal (374) may be coupled to the frequency decrease component (352). In a fourth PLL circuit device configuration in which the filter capacitor (306) has a reference that is coupled to a higher potential and the VCO (308) is designed to decrease the frequency adjustment in response to a decreasing VCO control signal (326), the secondary error-frequency signal (374) may be coupled to the frequency decrease component (352).

The state machine (402) may be configured to control the pulse widths of the secondary error frequency signal (374). In the example of FIG. 4, the state machine (402) is configured to receive the first error-frequency-increase signal (370) and the first error-frequency-decrease signal (372) and apply a state control process. The state control process of the state machine (402) may include the state machine increasing or decreasing a tuning output (482) based on the previous tuning output of the state machine and based on whether the first error-frequency-increase signal (370) or the first error-frequency-decrease was received. The error generator (404) may use the tuning output (482) to adjust the pulse widths of the secondary error-frequency signal (374).

For example, if the state machine (402) is in a first state and the first error-frequency-increase signal (370) is received, the state machine (402) may generate a tuning output (482) that instructs the error generator (404) to generate the secondary error-frequency signal (374) of a first pulse width. Continuing with this example, if the state machine (402) during the next reference cycle receives again the first error-frequency-increase signal (370), the state machine (402) may move to a second state and generate a tuning output that instructs the error generator to generate the secondary error-frequency signal (374) of a second pulse width that depends on the configuration of the PLL circuit device. For example, in the first PLL circuit device configuration and the fourth PLL circuit device configuration, if the first error-frequency-increase signal (370) is received, then the state machine (402) may advance to the next higher state up to the highest state, where each higher state generates a tuning output instructing the error generator to generate the secondary error-frequency signal with larger pulse widths. Likewise in these two configurations, if the first error-frequency-decrease signal (372) is received, then the state machine (402) may move to the next lower state down to the lowest state. In the second PLL circuit device configuration and the third PLL circuit device configuration, if the first error-frequency-decrease signal (372) is received, then the state machine (402) may advance to the next higher state up to the highest state. Likewise in these two configurations, if the first error-frequency-increase signal (370) is received, then the state machine (402) may move to the next lower state down to the lowest state. The state machine (402) may be configured to have any number of states with any amount of granularity between pulse width adjustments. Increasing the states also enables a more precise eventual settling of reference signal (318) with respect to the edge of feedback signal (328) over more reference clock cycles.

In the example of FIG. 4, the state machine (402) is also configured to receive an external tuning input (480). In response to receiving the external tuning input (480), the state machine (402) becomes bypassed, which gives a user the ability to control the tuning output (482), hence the delay of the programmable buffer (560) in the error generator (404) (and hence the pulse widths of the secondary error-frequency signal (374)). That is, activating the external tuning input (480) stops the secondary correction circuit's automated cycle-to-cycle width adjustments of the secondary error-frequency signal (374), which may be useful, for example, during debugging operations of the PLL circuit device.

The error generator (404) of FIG. 4 is coupled to the divided VCO output signal (396) and to the tuning output (482) and generates the secondary error-frequency signal (374). As explained above, the error generator (404) may be configured to detect a particular edge of the divided VCO output signal (396) and in response to the detection, generate a secondary error-frequency signal (374) having a pulse width controlled by the tuning output (482). By generating secondary error-frequency signal with adjustable pulse widths, the secondary correction circuit (390) of FIG. 4 has greater control over the amount of charge provided by the charge pump (304) to the filter capacitor (306) and therefore greater control over the amount of frequency adjustment provided by the VCO (308).

Figure 5:
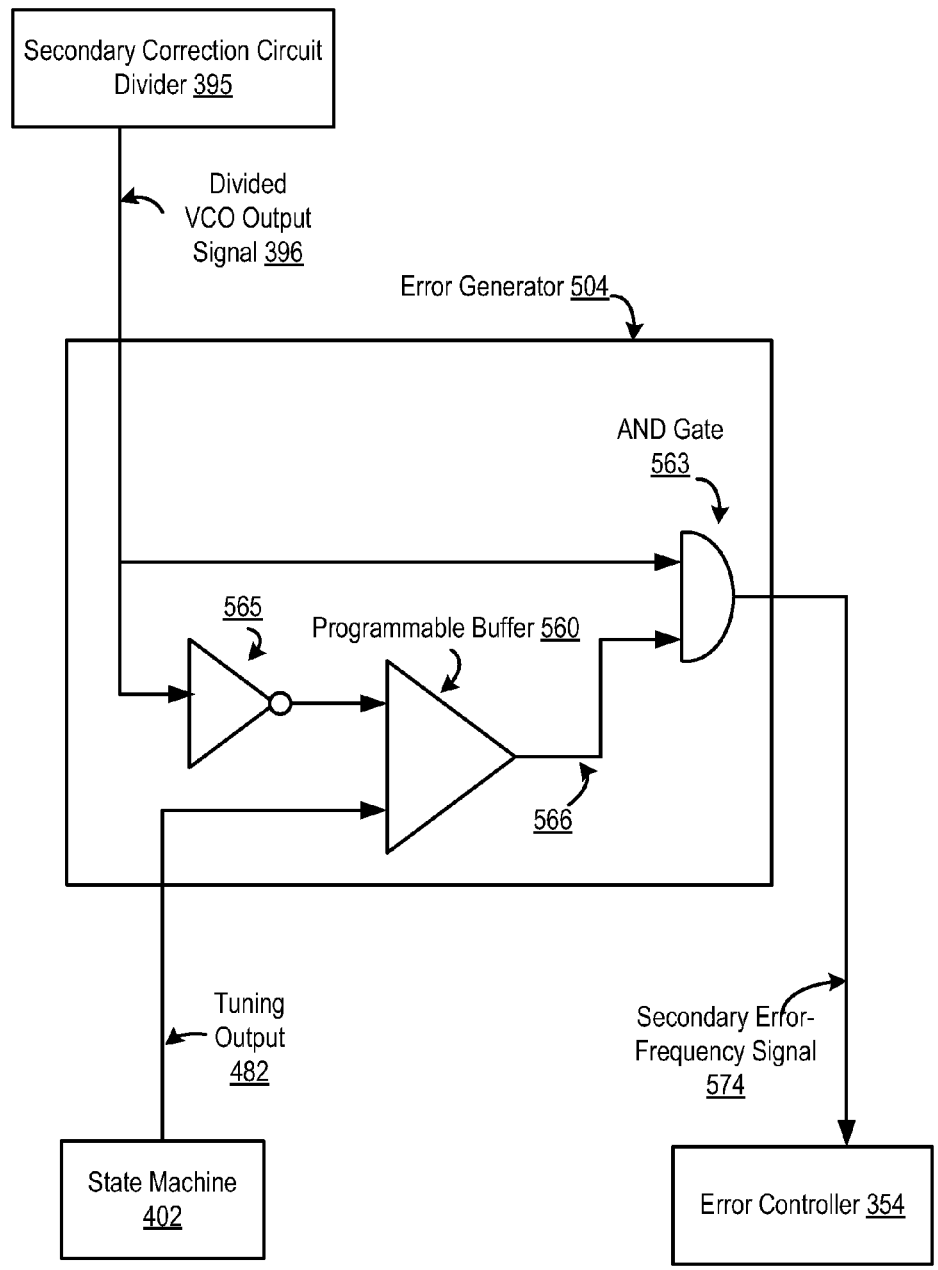
FIG. 5 sets forth a diagram of another example of a leakage tolerant PLL circuit device configured according to embodiments of the present invention.

FIG. 5 sets forth a diagram of another example of a PLL circuit device configured according to embodiments of the present invention. In the example of FIG. 5, one embodiment of an error generator is illustrated. That is, the circuitry of the error generator (504) is provided as an example. Readers of skill in the art realize that that any number of logical components may be implemented to generate a secondary error-frequency signal having a particular pulse width controlled by the tuning output (482) of the state machine (402).

In the example of FIG. 5, the error generator (504) acts as a programmable rising-edge pulse generator that generates a pulse in response to a rising edge of the divided VCO output signal (396). The error generator (504) includes an inverter (565) that receives an input from divided VCO output signal (396). The output of the inverter (565) is provided to a programmable buffer (560) which also receives as an input, the tuning output (482). Based on the tuning output (482), the programmable buffer (560) generates a signal (566) that is input into an AND gate (563) along with divided VCO output signal (396) to generate the secondary error-frequency signal (574), which is provided to the error controller (354). In another embodiment, a programmable falling-edge pulse generator may be utilized. For example, the AND gate (563) may be replaced with a NOR gate. In another embodiment, a programmable rising and falling edge pulse generator may be utilized. For example, the AND gate (563) may be replaced with an XNOR gate.

Figure 6:
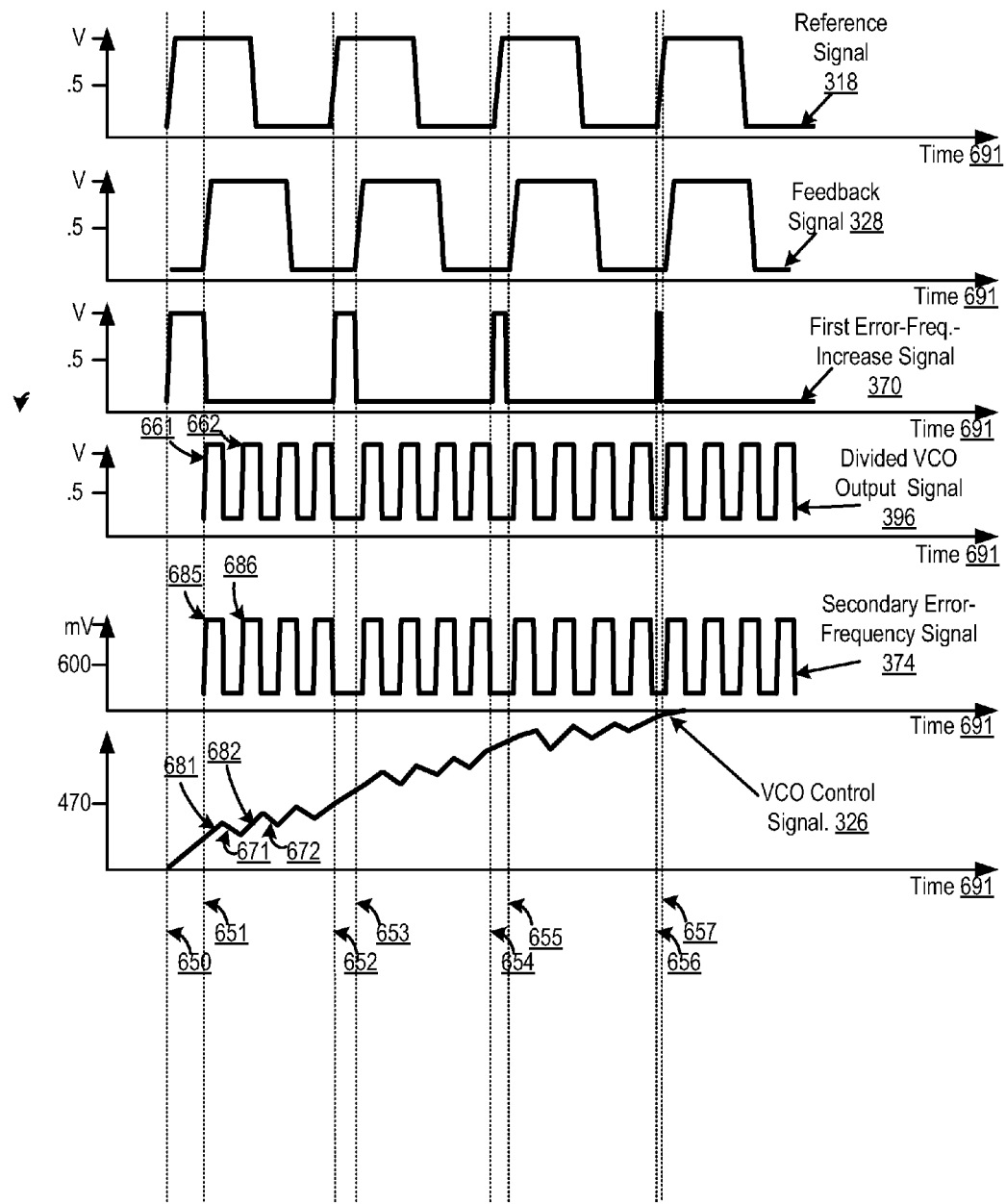
FIG. 6 sets forth a diagram illustrating an example of a transient response of a leakage tolerant PLL circuit device configured according to embodiments of the present invention.

FIG. 6 sets forth a diagram illustrating an example of a transient response of a leakage tolerant PLL circuit device configured according to embodiments of the present invention. As explained above, the goal of a PLL circuit device is to lock a phase of a feedback signal to a phase of a reference signal. For example, the leakage tolerant PLL circuit device of FIG. 3 may be programmed to lock the feedback signal (328) to the reference signal (318). The transient response of FIG. 6 illustrates the reference signal (318) and the feedback signal (328) at multiple time points (650-657) over time (691). At the time point (650), there is a phase difference between the two signals (318, 328). That is, the rising edge of the reference signal (318) begins at the time point (650) and the next rising edge of the feedback signal (328) begins at the time point (651). In response to detecting this difference between the two signals, the phase detector (302) generates the first error-frequency-increase signal (370) during the two time points (650, 651) and the charge pump provides a corresponding charge to the filter capacitor (306). During the time points (650, 651), a VCO control signal (326) is generated that corresponds to the charge of the filter capacitor (306). Between the time point (651) and the time point (652), the first error-frequency-increase signal (370) is not generated but the pulses of the secondary error-frequency signal (374) are generated.

As explained above, the secondary error-frequency signal (374) is used to offset the filter capacitor (306) discharging between pulses of the first error-frequency-increase signal (370). The secondary error-frequency signal (374) is generated based the divided VCO output signal (396). The secondary correction circuit divider (395) may be configured to a frequency that is a division of the VCO output signal (330) such that the division value is less than or equal to the division value of feedback divider (398). In this example, a secondary correction divider value of four is used to generate divided output signal (396), and the rising edge of divided output signal (396) causes the error generator (404) to generate pulses of the secondary error-frequency signal (374).

For example, in response to detecting the rising edge (661) of the first pulse of the divided VCO output signal (396), the error generator (404) generates the secondary error-frequency signal pulse (685), which in turn instructs the charge pump (304) to charge the filter capacitor (306), which results in the increase (681) in the VCO control signal (326). However, after the secondary error-frequency signal pulse (685) ends, the filter capacitor (306) begins to discharge as is evident by the decline (671) in the VCO control signal (326). In response to detecting the rising edge (662) of the second pulse of the divided VCO output signal (396), the error generator (404) generates the secondary error-frequency signal pulse (686), which results in the increase (682) in the VCO control signal (326). However, after the secondary error-frequency signal pulse (686) ends, the filter capacitor (306) begins to discharge as is evident by the decline (672) in the VCO control signal (326). By periodically instructing the charge pump (304) to charge the filter capacitor (306), the VCO control signal (326) generated by the filter capacitor (306) may remain accurate. Thus, the VCO (308) receives proper frequency adjustment information which improves the accuracy of the frequency adjustment provided by the VCO (308) to the phase of the VCO output signal (330).

Figure 1:
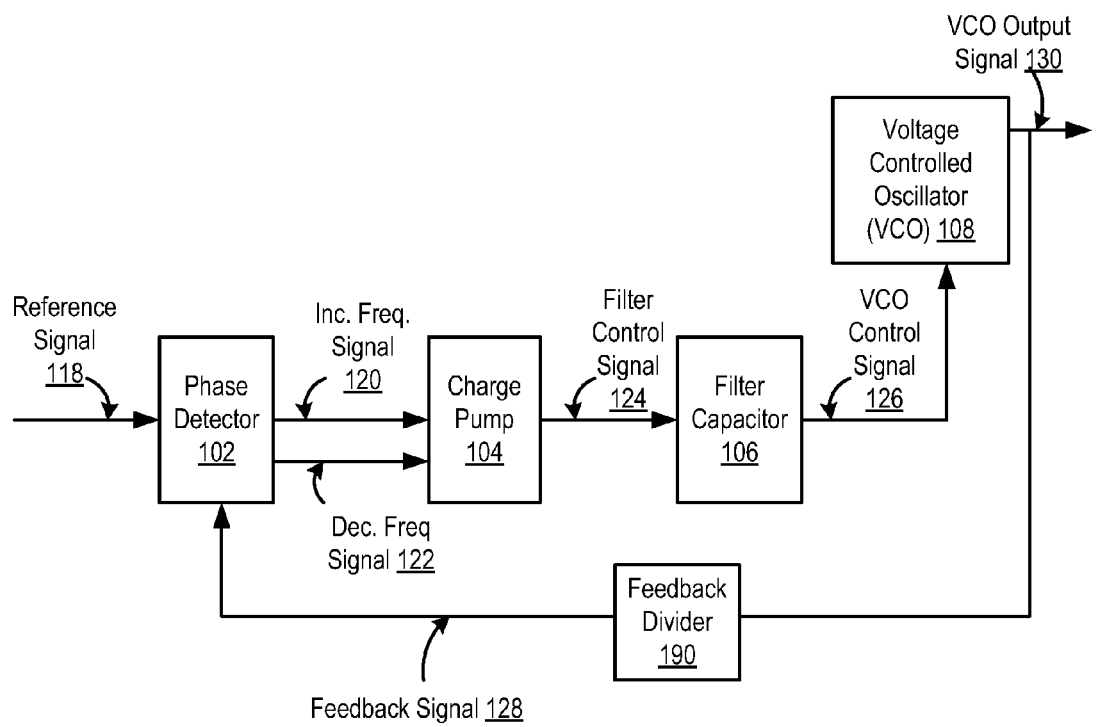
FIG. 1 sets forth a diagram of an example of a phase locked loop (PLL) circuit device found in the prior art.
Figure 2:
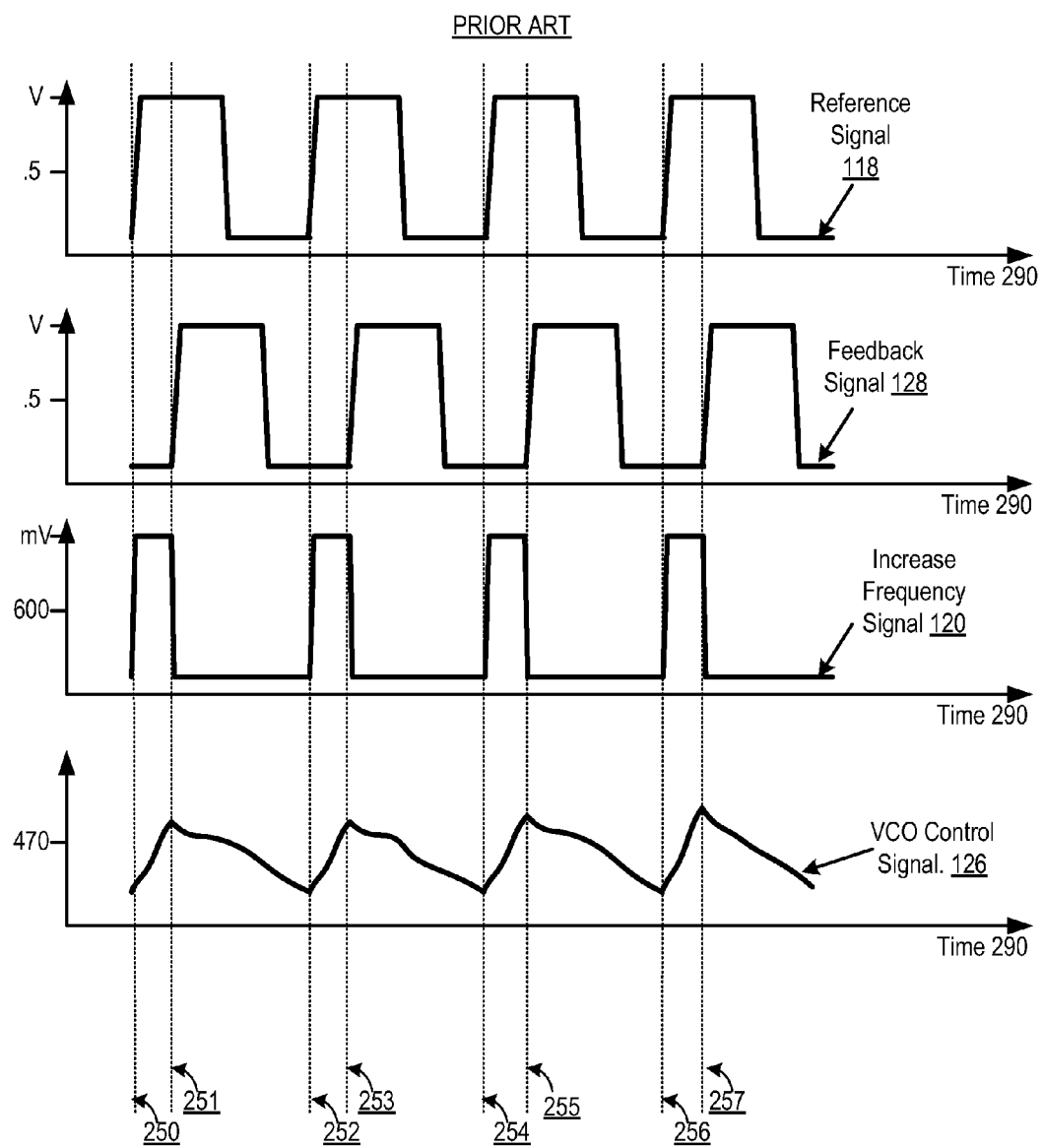
FIG. 2 sets forth a diagram illustrating an example of a transient response of the prior art PLL circuit device of FIG. 1.

The greater control and efficiency of a leakage tolerant PLL circuit device relative to the prior art PLL circuit device illustrated in FIG. 2 is further evident between the time point (652) and the time point (653) of FIG. 6. Between the time point (652) and the time point (653) in FIG. 6, the phase difference between the reference signal (318) and the feedback signal (328) decreases relative to the phase difference between the time point (252) and the time point (253) of in FIG. 2. Decreasing the phase difference reduces the pulse width of the first error-frequency increase signal (370), as seen between the time point (652) and the time point (653). As a consequence of the VCO phase adjustments, the feedback signal (328) in FIG. 6 continues to frequency adjust until the rising edge of the reference signal (318) almost coincides with the rising edge of the feedback signal (328), as seen between the time point (656) and the time point (657). Although it is not illustrated, if the feedback signal were to over-shift, then the first error-frequency-decrease signal (372) may be generated.

For further explanation, FIG. 7 sets forth a flowchart of an example of a method of locking a phase of a feedback signal to a phase of a reference signal using a leakage tolerant phase locked loop (PLL) circuit device according to embodiments of the present invention. By way of example, the method of FIG. 7 may utilize the leakage tolerant PLL circuit devices of FIGS. 3-5 and therefore the elements of FIGS. 3-5 are referenced in FIG. 7 for ease of explanation.

The method of FIG. 7 includes generating (702), by a primary loop (340) of the PLL circuit device, the feedback signal (328) having a phase that substantially matches a phase of the reference signal (318). Generating (702), by a primary loop (340) of the PLL circuit device, the feedback signal (328) having a phase that substantially matches a phase of the reference signal (318) may be carried out by determining the phase difference between the feedback signal (328) and the reference signal (318); and adjusting the frequency of the feedback signal (328) based on the determined phase difference.

The method of FIG. 7 also includes generating (704), by the VCO (308), a VCO output signal (330) and providing the VCO output signal (330) to the feedback divider (398). Generating (704), by the VCO (308), a VCO output signal (330) and providing the VCO output signal (330) to the feedback divider (398) may be carried out by controlling oscillation of the VCO output signal (330) based on a VCO control signal (326) provided by a filter capacitor (306).

The method of FIG. 7 includes generating (706), by the phase detector (302), one of a first error-frequency-increase signal (370) and a first error-frequency-decrease signal (372) based on a determination of the phase difference between the feedback signal (328) and the reference signal (318). Generating (706), by the phase detector (302), one of a first error-frequency-increase signal (370) and a first error-frequency-decrease signal (372) based on a determination of the phase difference between the feedback signal (328) and the reference signal (318) may be carried out by determining the phase difference between the reference signal (318) and the feedback signal (328); and if the determined phase difference indicates that the feedback signal (328) is lagging behind the reference signal (318), generating the first error-frequency-increase signal (370); and if the determined phase difference indicates that the feedback signal (328) is leading the reference signal (318), generating the first error-frequency-decrease signal (372).

The method of FIG. 7 also includes generating (708), by a secondary correction circuit divider (395) coupled between the VCO (308) and a secondary correction circuit (390), a divided VCO output signal (396) based on the VCO output signal (330). Generating (708), by a secondary correction circuit divider (395) coupled between the VCO (308) and a secondary correction circuit (390), a divided VCO output signal (396) based on the VCO output signal (330) may be carried out by dividing the VCO output signal (330) by a particular amount.

The method of FIG. 7 includes generating (710), by the secondary correction circuit (390), a pulse of a secondary error-frequency signal (374) in response to detecting a particular edge of the divided VCO output signal (396). Generating (710), by the secondary correction circuit (390), a pulse of a secondary error-frequency signal (374) in response to detecting a particular edge of the divided VCO output signal (396) may be carried out by examining the divided VCO output signal (396) for an indication of a particular type of edge. For example, the secondary correction circuit (390) may be configured to generate a pulse of the secondary error-frequency signal (374) in response to detecting a rising edge of the divided VCO output signal (396).

The method of FIG. 7 also includes based on at least one of the first error-frequency-increase signal (370), the first error-frequency-decrease signal (372), and the secondary error-frequency signal (374), controlling (712), by the primary loop (340), a frequency adjustment provided by the VCO (308) to the VCO output signal (396). Controlling (712), by the primary loop (340), a frequency adjustment provided by the VCO (308) to the VCO output signal (396) may be carried out by receiving the VCO control signal (326) from the filter capacitor (306); and increasing or decreasing the frequency of the VCO output signal (330) based on the received VCO control signal (326).

Figure 8:
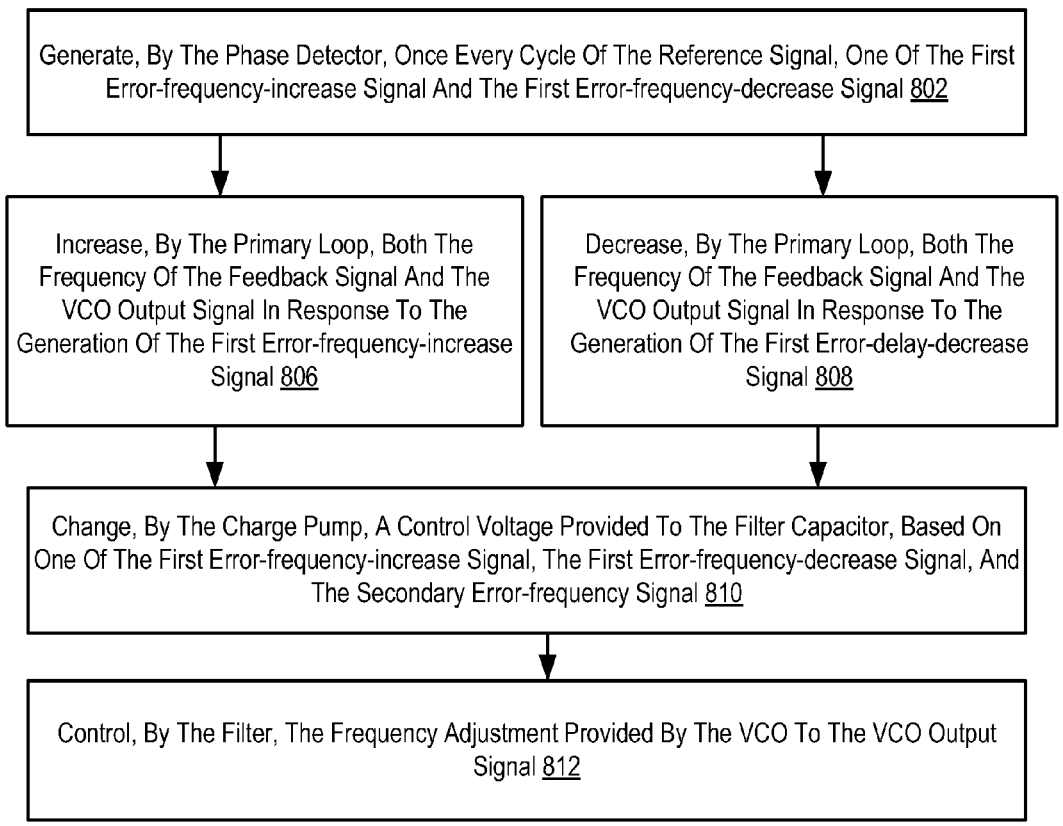
FIG. 8 sets forth a flowchart of another example of a method of locking a phase of a feedback signal to a phase of a reference signal using a leakage tolerant phase locked loop (PLL) circuit device according to embodiments of the present invention.

For further explanation, FIG. 8 sets forth a flowchart of another example of a method of locking a phase of a feedback signal to a phase of a reference signal using a leakage tolerant phase locked loop (PLL) circuit device according to embodiments of the present invention. By way of example, the method of FIG. 8 may utilize the leakage tolerant PLL circuit devices of FIGS. 3-5 and therefore the elements of FIGS. 3-5 are referenced in FIG. 8 for ease of explanation.

The method of FIG. 8 includes generating (802), by the phase detector (302), once every cycle of the reference signal (318), one of the first error-frequency-increase signal (370) and the first error-frequency-decrease signal (372). Generating (802), by the phase detector (302), once every cycle of the reference signal (318), one of the first error-frequency-increase signal (370) and the first error-frequency-decrease signal (372) may be carried out by comparing the reference signal (318) to the feedback signal (328); and determining a direction and amount of phase difference.

The method of FIG. 8 includes in response to the generation of the first error-frequency-increase signal (370), increasing (806), by the primary loop (340), both the frequency of the feedback signal (328) and the VCO output signal (330). Increasing (806), by the primary loop (340), both the frequency of the feedback signal (328) and the VCO output signal (330) may be carried out instructing by the VCO (308) to increase the frequency of the reference signal (318) within the VCO (308), thus increasing the frequency of the resulting feedback signal (328) and VCO output signal (330).

The method of FIG. 8 also includes in response to the generation of the first error-frequency-decrease signal (372), decreasing (808), by the primary loop (340), both the frequency of the feedback signal (328) and the VCO output signal (330). Decreasing (808), by the primary loop (340), both the frequency of the feedback signal (328) and the VCO output signal (330) may be carried out by instructing by the VCO (308) to decrease the frequency of the reference signal (318) within the VCO (308), thus decreasing the frequency of the resulting feedback signal (328) and VCO output signal (330).

The method of FIG. 8 includes based on one of the first error-frequency-increase signal (370), the first error-frequency-decrease signal (372), and the secondary error-frequency signal (374), changing (810), by the charge pump (304), a control voltage (324) provided to the filter capacitor (306). Changing (810), by the charge pump (304), a control voltage (324) provided to the filter capacitor (306) may be carried out by charging a filter capacitor (306).

The method of FIG. 8 includes based on the control voltage (324), controlling (812), by the filter capacitor (306), the phase adjustment provided by the VCO (308) to both the VCO output signal (330) and the feedback signal (328). Controlling (812), by the filter capacitor (306), the phase adjustment provided by the VCO (308) to both the VCO output signal (330) and the feedback signal (328) may be carried out by charging or discharging the filter capacitor (306).

The flowchart and diagrams in the Figures illustrate the architecture, functionality, and operation of possible implementations of PLL circuit devices and methods according to various embodiments of the present invention. It should be noted that, in some alternative implementations, the functions noted in the blocks and flowcharts may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A leakage tolerant phase locked loop (PLL) circuit device, the PLL circuit device comprising:
   a primary loop configured to generate a feedback signal having a phase that substantially matches a phase of a reference signal, wherein the primary loop includes a phase detector, an error controller, a voltage controlled oscillator (VCO), and a feedback divider, wherein the VCO is configured to generate a VCO output signal; the feedback divider configured to generate the feedback signal based on the VCO output signal, wherein the phase detector is configured to generate one of a first error-frequency-increase signal and a first error-frequency-decrease signal based on a determination of the phase difference between the feedback signal and the reference signal;
   a secondary correction circuit configured to generate a secondary error-frequency signal wherein the secondary correction circuit includes an error generator; and
   a secondary correction circuit divider that is configured to generate a divided VCO output signal based on the VCO output signal, wherein the error generator is configured to generate the secondary error-frequency signal in response to detecting a particular edge of the divided VCO output signal, wherein the primary loop is configured to control, based on at least one of the first error-frequency-increase signal, the first error-frequency-decrease signal, and the secondary error-frequency signal, a frequency adjustment provided by the VCO to the VCO output signal.

2. The PLL circuit device of claim 1 wherein the error controller includes a frequency increase component that is coupled to the phase detector to receive the first error-frequency-increase signal from the phase detector; and wherein the error controller includes a frequency decrease component that is coupled to the phase detector to receive the first error-frequency-decrease signal from the phase detector.

3. The PLL circuit device of claim 2 wherein the error generator of the secondary correction circuit is coupled to only one of the frequency increase component and the frequency decrease component of the error controller.

4. The PLL circuit device of claim 3 wherein the error generator of the secondary correction circuit is coupled to only one of the frequency increase component and the frequency decrease component in accordance with a direction of capacitor leakage in a filter included in the primary loop.

5. The PLL circuit device of claim 1 wherein in response to detecting the generation of the first error-frequency-increase signal, the primary loop is configured to increase the frequency of both the feedback signal and the VCO output signal; and wherein in response to detecting the generation of the first error-frequency-decrease signal, the primary loop is configured to decrease the frequency of both the feedback signal and the VCO output signal.

6. The PLL circuit device of claim 5 wherein the amount that the primary loop is configured to increase the frequency of the feedback signal and the VCO output signal is based on the pulse width of the first error-frequency-increase signal; and wherein the amount that the primary loop is configured to decrease the frequency of the feedback signal and the VCO output signal is based on the pulse width of the first error-frequency-decrease signal.

7. The PLL circuit device of claim 6 wherein the amount that the primary loop is configured to increase the frequency of the feedback signal and the VCO output signal is further based on pulse widths of the secondary error-frequency signal received by the error controller from the error generator.

8. The PLL circuit device of claim 1 wherein the phase detector is configured to generate once every cycle of the reference signal, one of the first error-frequency-increase signal and the first error-frequency-decrease signal.

9. The PLL circuit device of claim 1 wherein the primary loop further includes a charge pump and a filter capacitor; wherein the charge pump is configured to change a control voltage provided to the filter capacitor based on one of the first error-frequency-increase signal, the first error-frequency-decrease signal, and the secondary error-frequency signal; wherein based on the control voltage, the filter capacitor is configured to control the frequency adjustment provided by the VCO to each of the VCO output signal and the feedback signal.

10. The PLL circuit device of claim 1 wherein pulse widths of the secondary error-frequency signal correspond to the previously arrived of one of the first error-frequency-increase signal and the first error-frequency-decrease signal.

11. A method of locking a phase of a feedback signal to a phase of a reference signal using a leakage tolerant phase locked loop (PLL) circuit device, the method comprising:
generating, by a primary loop of the PLL circuit device, the feedback signal having a phase that substantially matches a phase of the reference signal; wherein the primary loop includes a phase detector, an error controller, a voltage controlled oscillator (VCO), and a feedback divider;
generating, by the VCO, a VCO output signal and providing the VCO output signal to the feedback divider;
generating, by the phase detector, one of a first error-frequency-increase signal and a first error-frequency-decrease signal based on a determination of the phase difference between the feedback signal and the reference signal;
generating, by a secondary correction circuit divider coupled between the VCO and a secondary correction circuit, a divided VCO output signal based on the VCO output signal;
generating, by the secondary correction circuit, a pulse of a secondary error-frequency signal in response to detecting a particular edge of the divided VCO output signal; and based on at least one of the first error-frequency-increase signal, the first error-frequency-decrease signal, and the secondary error-frequency signal, controlling, by the primary loop, a frequency adjustment provided by the VCO to the VCO output signal.

12. The method of claim 11 wherein the error controller includes a frequency increase component that is coupled to the phase detector to receive the first error-frequency-increase signal from the phase detector; and wherein the error controller includes a frequency decrease component that is coupled to the phase detector to receive the first error-frequency-decrease signal from the phase detector.

13. The method of claim 12 wherein the secondary correction circuit includes an error generator that is coupled to only one of the frequency increase component and the frequency decrease component.

14. The method of claim 13 wherein the error generator of the secondary correction circuit is coupled to only one of the frequency increase component and the frequency decrease component in accordance with a direction of capacitor leakage in a filter capacitor included in the primary loop.

15. The method of claim 11 further comprising:
in response to the generation of the first error-frequency-increase signal, increasing, by the primary loop, both the frequency of the feedback signal and the VCO output signal; and
in response to the generation of the first error-frequency-decrease signal, decreasing, by the primary loop, both the frequency of the feedback signal and the VCO output signal.

16. The method of claim 15 wherein the amount that the primary loop increases the frequency of the feedback signal and the VCO output signal is based on pulse widths of the first error-frequency-increase signal; and wherein the amount that the primary loop decreases the frequency of the feedback signal and the VCO output signal is based on pulse widths of the first error-frequency-decrease signal.

17. The method of claim 16 wherein the amount that the primary loop increases the frequency of the feedback signal and the VCO output signal is further based on pulse widths of the secondary error-frequency signal received by the error controller.

18. The method of claim 11 further comprising generating, by the phase detector, once every cycle of the reference signal, one of the first error-frequency-increase signal and the first error-frequency-decrease signal.

19. The method of claim 11 wherein the primary loop further includes a charge pump and a filter capacitor; and the method further comprising:
based on one of the first error-frequency-increase signal, the first error-frequency-decrease signal, and the secondary error-frequency signal, changing, by the charge pump, a control voltage provided to the filter capacitor; and
based on the control voltage, controlling, by the filter capacitor, the frequency adjustment provided by the VCO to both the VCO output signal and the feedback signal.

20. The method of claim 11 wherein pulse widths of the secondary error-frequency signal correspond to the previously arrived of one of the first error-frequency-increase signal and the first error-frequency-decrease signal.

* * * * *